(12) United States Patent
Lin et al.

(10) Patent No.: US 10,978,337 B2
(45) Date of Patent: Apr. 13, 2021

(54) ALUMINUM-CONTAINING LAYERS AND METHODS OF FORMING THE SAME (71) Applicant: Taiwan Semiconductor Manufacturing Co., Ltd., Hsinchu (TW)

(72) Inventors: Jyh-nan Lin, Hsinchu (TW); Mu-Min Hung, Hsinchu (TW); Kai-Shiung Hsu, Hsinchu (TW); Ding-I Liu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/550,901

(22) Filed: Aug. 26, 2019

(65) Prior Publication Data
US 2020/0090986 A1 Mar. 19, 2020

Related U.S. Application Data (60) Provisional application No. 62/732,724, filed on Sep. 18, 2018.

(51) Int. Cl.
*H01L 21/768* (2006.01)
*H01L 23/522* (2006.01)
(Continued)

(52) U.S. Cl.
CPC ........ *H01L 21/76834* (2013.01); *C23C 16/34* (2013.01); *C23C 16/45544* (2013.01); *C23C 16/45553* (2013.01); *H01L 21/0228* (2013.01); *H01L 21/02178* (2013.01); *H01L 21/02205* (2013.01); *H01L 21/76802* (2013.01); *H01L 21/76877* (2013.01); *H01L 23/5226* (2013.01)

(58) Field of Classification Search
None
See application file for complete search history.

(56) References Cited

U.S. PATENT DOCUMENTS 5,830,774 A * 11/1998 Klingbeil, Jr. ...... H01L 21/0331
438/672
6,214,284 B1 * 4/2001 Soudarev ............... C04B 35/581
164/98

(Continued)

FOREIGN PATENT DOCUMENTS

TW 201724180 A 7/2017

*Primary Examiner* — Thien F Tran
(74) *Attorney, Agent, or Firm* — Haynes and Boone, LLP (57) ABSTRACT Aluminum-containing layers and systems and methods for forming the same are provided. In an embodiment, a method includes depositing an aluminum-containing layer on a substrate in a chamber by atomic layer deposition. The depositing further includes contacting the substrate with an aluminum-containing precursor in a first pulse having a first peak pulse flow rate and a first pulse width; contacting the substrate with a nitrogen-containing precursor; contacting the substrate with the aluminum-containing precursor in a second pulse having a second peak pulse flow rate and a second pulse width; and contacting the substrate with the nitrogen-containing precursor. The first peak pulse flow rate is greater than the second peak pulse flow rate. The first pulse width is smaller than the second pulse width.

20 Claims, 9 Drawing Sheets (51) Int. Cl.
    *H01L 21/02*     (2006.01)
    *C23C 16/455*     (2006.01)
    *C23C 16/34*     (2006.01)

(56) References Cited

U.S. PATENT DOCUMENTS

| | | |
|---|---|---|
| 9,520,362 B2 | 12/2016 | Lin et al. |
| 9,613,856 B1 | 4/2017 | Yang et al. |
| 9,716,032 B2 | 7/2017 | Tang et al. |
| 9,972,529 B2 | 5/2018 | Yang et al. |
| 10,163,691 B2 | 12/2018 | Shih et al. |
| 10,170,322 B1 | 1/2019 | Cheng et al. |
| 10,312,077 B2 | 6/2019 | Ramvall |
| 2005/0221021 A1* | 10/2005 | Strang ............... H01J 37/32082 427/569 |
| 2020/0006137 A1* | 1/2020 | Belyansky ........ H01L 21/31116 |

\* cited by examiner

ALUMINUM-CONTAINING LAYERS AND METHODS OF FORMING THE SAME

PRIORITY DATA

The present application claims the benefit of U.S. Provisional Application No. 62/732,724, entitled "Aluminum-Containing Layers and Methods of Forming the Same," filed Sep. 18, 2018, herein incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, material deposition techniques, such as chemical vapor deposition (CVD), plasma-enhanced chemical vapor deposition (PECVD), atomic layer deposition (ALD), and plasma-enhanced atomic layer deposition (PEALD), have been used to form various layers of different properties in a semiconductor device. Although material deposition techniques have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

Figure 1:
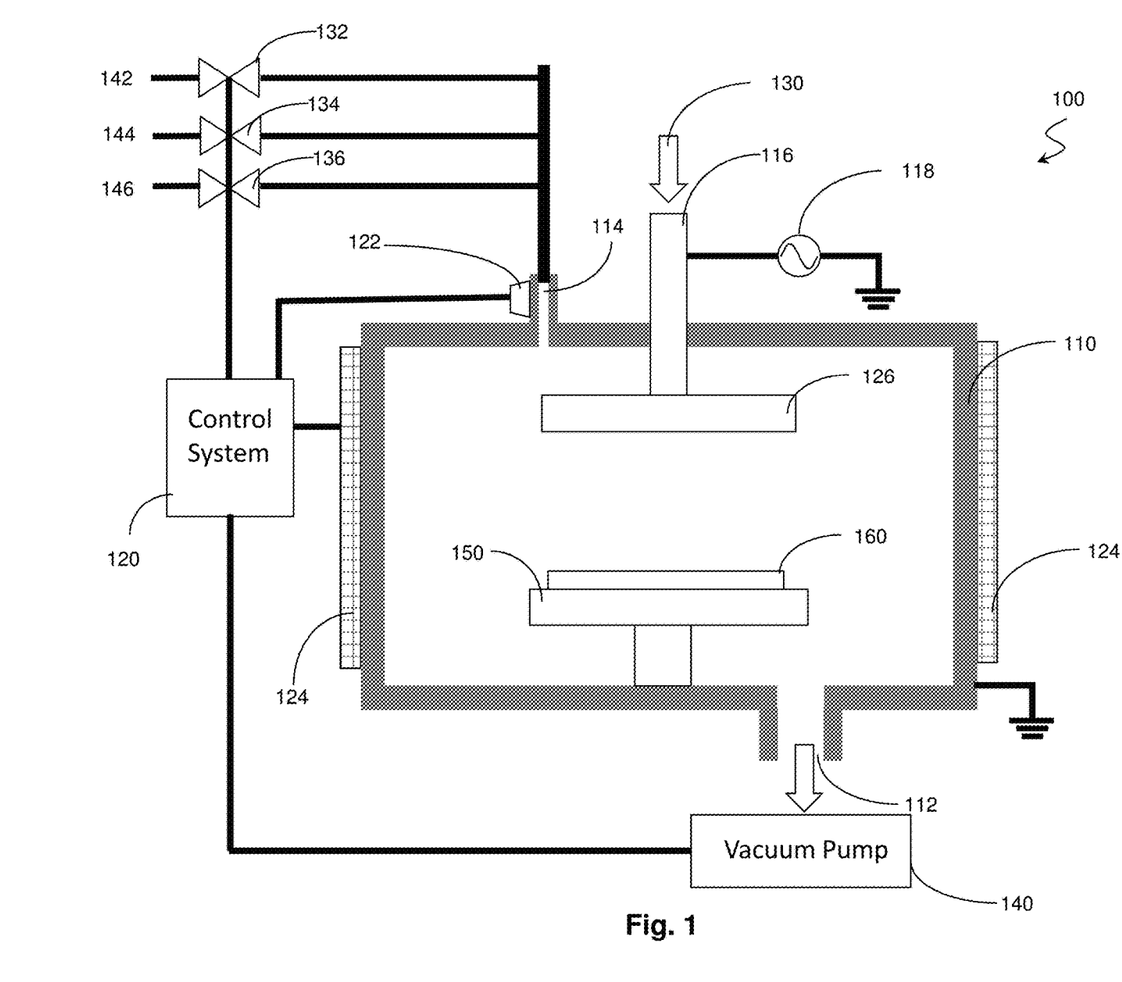
FIG. 1 is a schematic diagram illustrating a deposition system, in accordance with some embodiments of the disclosure.

FIG. 1 is a schematic diagram illustrating a deposition system 100. The deposition system 100 includes a reactor or chamber 110 and a control system 120. The chamber 110 includes an inlet port 114, exhaust port 112, and a substrate stage 150 configured to support a substrate 160 mounted thereon. In some embodiments, the deposition system 100 can include a plasma generator 116 that generates plasma by applying radio frequency (RF) signal to a gas from a gas source 130. The RF signal can be generated by an RF power source 118 coupled to the plasma generator 116. The plasma generated by the plasma generator 116 can be directed to the substrate 160 via a showerhead 126. The control system 120 is coupled to a flow rate sensor 122 configured to measure the flow rate of gas flowing through the inlet port 114 into the chamber 110. In some embodiments, the control system 120 is electrically coupled to and is configured to control more than one valves. In some embodiments represented in FIG. 1, the control system 120 is electrically coupled to and is configured to control a valve 132 that governs fluid communication between a gas source 142 and the inlet port 114, a valve 134 that governs fluid communication between a gas source 144 and the inlet port 114, and a valve 136 that governs fluid communication between a gas source 146 and the inlet port 114. In some embodiments, the control system 120 is electrically coupled to and is configured to control a heating unit 124 that can increase the temperature of the chamber 110 to a temperature that is conductive to the reaction of the precursors.

The control system 120 can be programmed to perform an atomic layer deposition (ALD) process for depositing of a material layer on the substrate 160. In an ALD process, the substrate 160 in the chamber 110 is exposed to the first precursor from the gas source 142 and the second precursor from the gas source 144 one at a time in an alternative manner. After the first precursor is put in contact with the substrate 160 and before the second precursor comes in contact with the substrate 160, the chamber 110 is purged of the first precursor by use of the purge gas from the gas source 146 while a layer of the first precursor is attached to the substrate 160. Then the second precursor from the gas source 144 is supplied into the chamber 110 via the inlet port 114 to contact the substrate 160. The second precursor is allowed to react with the first precursor attached to the substrate 160. At this point, a layer formed by a reaction of the first precursor and the second precursor is deposited on the substrate 160. The chamber 110 is then purged of the second precursor by use of the purge gas from the gas source 146. The supplying of the first precursor, purging of the first precursor, supplying of the second precursor, and purging of the second precursor together can be collectively referred to as a cycle as the cycle can deposit one single layer formed by the reaction between the first and second precursors. In some instances, the temperature of the chamber 110 can be maintained at a temperature conducive to the reaction between the first and second precursors. In some embodiments, plasma generated by the plasma generator 116 out of an inert gas from the gas source 130, such as argon (Ar) and nitrogen ($N_2$), can be used to enhance or accelerate the ALD process. In those embodiments, the process can be referred to as a plasma enhanced atomic layer deposition (PEALD) process.

In some embodiments where an aluminum nitride (AlN) layer is to be deposited on the substrate 160 by ALD, the first precursor from the gas source 142 can be trimethylaluminum (TMA), the second precursor from the gas source 144 can be ammonia (NH3), and the purge gas from the gas source 146 can be nitrogen ($N_2$), argon (Ar), or helium (He). The control system 120 can control the heating unit 124 to increase the temperature of the chamber 110 to between about 300° C. and about 400° C. Once the temperature in the chamber 110 reaches a steady state, the control system can open the valve 132 to allow TMA from the gas source 142 to flow into the chamber 110. TMA can attach to the substrate 160 and form a TMA layer thereon. To purge the chamber 110 of TMA, the control system 120 closes the valve 132, opens the valve 136, and activates the vacuum pump 140 in fluid communication with the exhaust port 112. The purge gas from the gas source 146 can displace TMA in the chamber 110. After the chamber 110 is purged of TMA, the control system 120 can close the valve 136, turns off the vacuum pump 140, and opens the valve 134 to supply ammonia from the gas source 144 into the chamber 110. Ammonia in contact with the substrate 160 can react and form covalent bonds with the TMA layer on the substrate 160. After ammonia is allowed to react with the TMA layer on the substrate 160, the control system 120 can close the valve 134, open the valve 136, and activates the vacuum pump 140 to purge the chamber 110 of ammonia. At this point, a single layer of AlN is formed on the substrate 160. If more single layers of AlN are needed to form an AlN layer of a desired thickness, the control system 120 can repeat the operations described above until the desired thickness is reached.

The flow rate sensor 122 can measure the instantaneous flow rates of the first and second precursors and sends the instantaneous flow rates to the control system 120. In some embodiments, the control system can take into consideration decrease in instantaneous flow rate of a precursor and compensate for the decreased flow rate by prolonging a duration in which the precursor is supplied to the chamber 110. For example, the gas source 142 can be a tank containing TMA and the saturated vapor pressure of TMA in the tank can decrease over time, resulting in a decreased flow rate. The control system 120 can monitor the instantaneous flow rate change of TMA by the flow rate sensor 122 and increases the time TMA is supplied to the chamber. In those embodiments, the control system 120 can maintain the quality and constituency of each MN single layer by maintaining a constant amount of precursors in contact with the substrate. In some implementations, the control system 120 can maintain a constant integral of instantaneous flow rate over time for supply of a precursor in each cycle. For ease of reference, the supply of TMA in a cycle can be referred to as a TMA pulse. In some instances, for each of the TMA pulse, the control system 120 monitors the instantaneous flow rate of TMA from the gas source 142 until it reaches a steady-state flow rate (or peak pulse flow rate). After a steady-state flow rate (or peak pulse flow rate) is reached, the control system 120 will integrate the instantaneous flow rate measured by the flow rate sensor 122 over a width of the TMA pulse. If the resulting integral is, for example, X, the control system 120 will maintain the same integral X for all subsequent TMA pulses. That is, if the instantaneous flow rate of TMA drops, the control system 120 will increase the width of the TMA pulse to maintain the integral at X. In some embodiments, the gas source 144 can be viewed as a constant pressure source and the control system 120 does not need to take into consideration of any pressure drop in ammonia and can control the valve 134 based on the duration during which the valve 134 is turned open in an ammonia cycle. That is, during an ammonia cycle, the control system 120 operates to open the valve 134 for a duration and then close the valve 134, irrespective of readings of the flow rate sensor 122.

In some embodiments where the drop of instantaneous flow rate of a precursor is linear or can be approximated by a first-degree polynomial. The integral for each TMA pulse can be represented by a product of the steady-state flow rate (peak pulse flow rate) and the duration after the peak pulse flow rate is reached. In some embodiments, the integral for each TMA pulse can further be represented by a product of the steady-state flow rate (peak pulse flow rate) and the entire duration of the TMA pulse.

Figure 2:
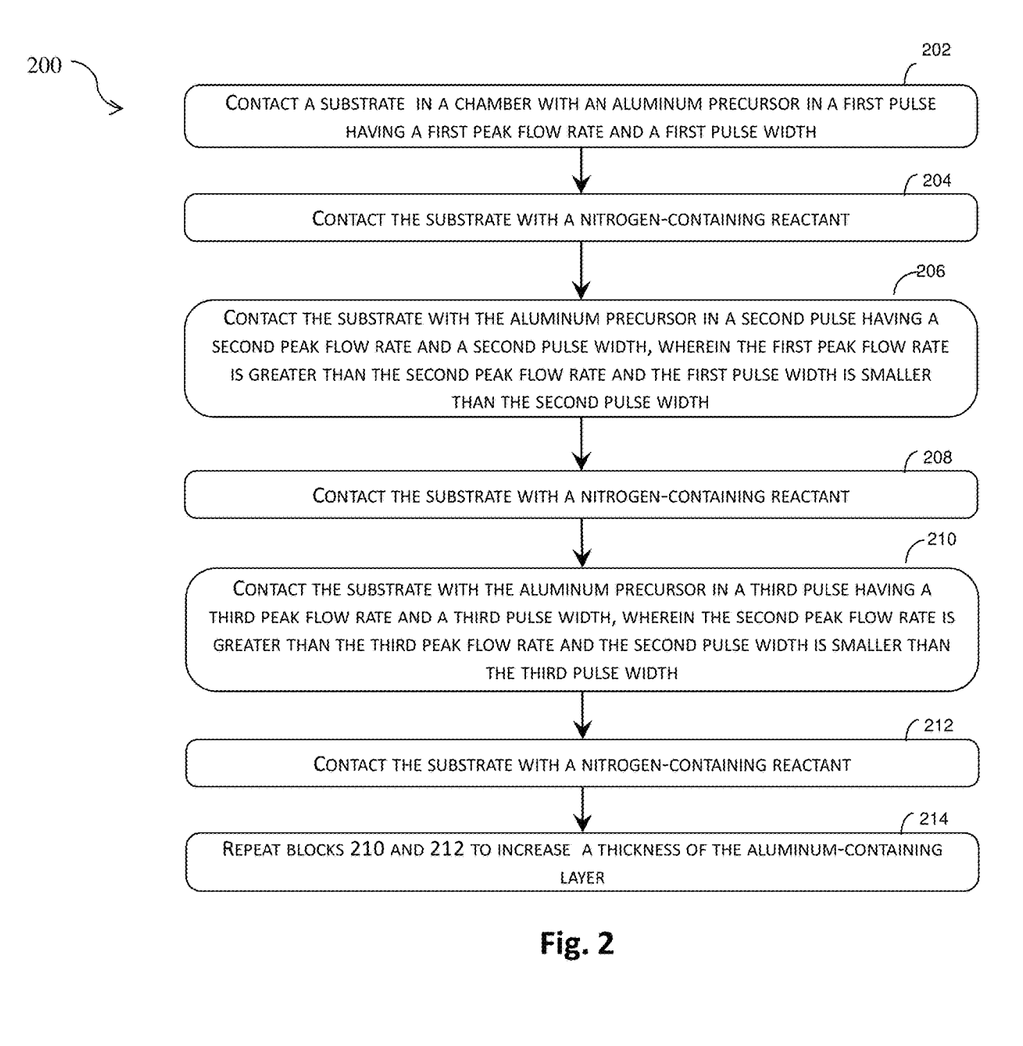
FIG. 2 illustrates a flow chart of a method of forming a material layer on a substrate by atomic layer deposition, in accordance with some embodiments of the disclosure.

Referring now to FIG. 2, illustrated therein is a flow chart of a method 200 of forming an aluminum-containing layer on a substrate by ALD. The method 200, as discussed below, can deposit a high density aluminum-containing layer that includes multiple atomic layers. The method 200 is merely an example, and is not intended to limit the present disclosure beyond what is explicitly recited in the claims. Additional operation can be provided before, during, and after the method 200, and some operations can be replaced, eliminated, or moved around for additional embodiments of the method 200. The method 200 will be described in conjunction with FIGS. 3, 4A, 4B, 5A, and 5B.

Figure 3:
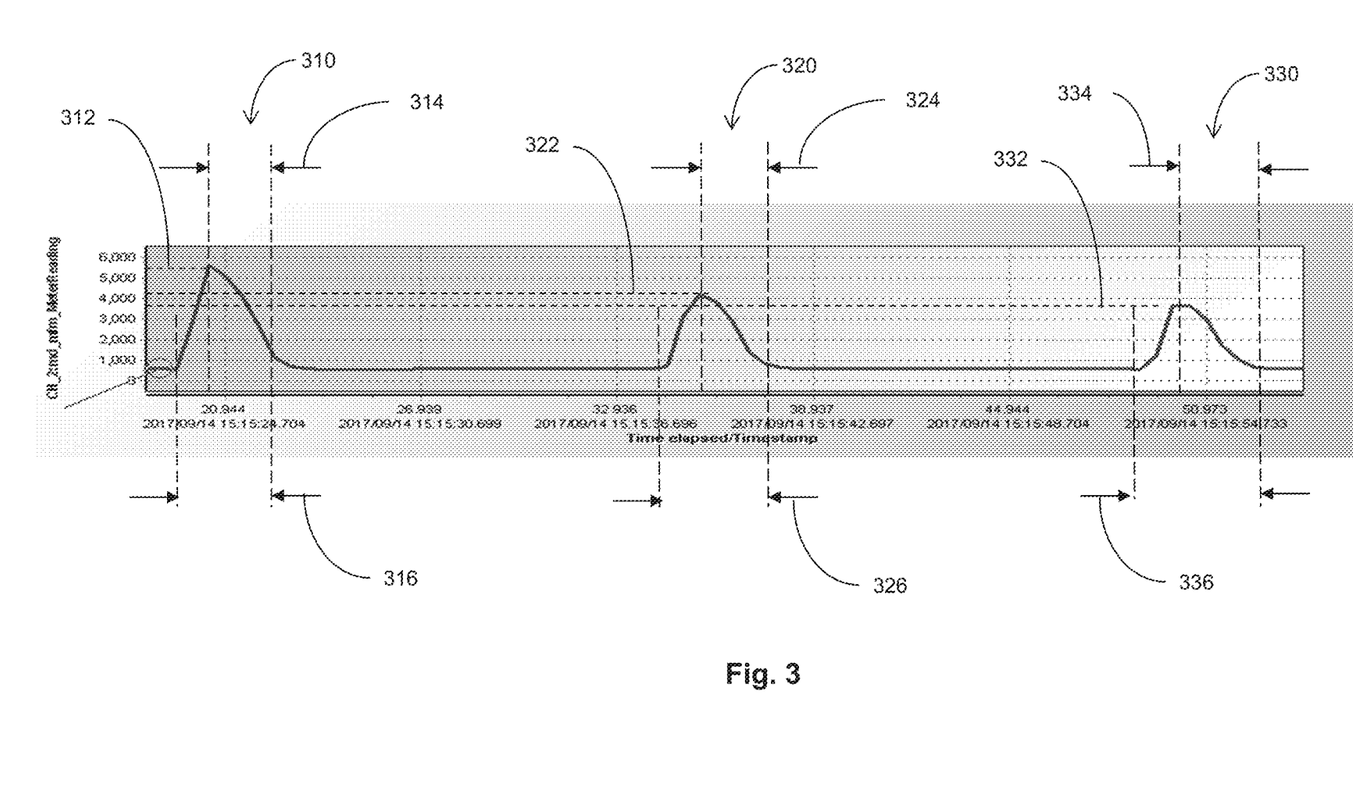
FIG. 3 illustrates three exemplary pulses of an aluminum precursor supplied into a chamber, in accordance with some embodiments of the disclosure.
Figure 4A:
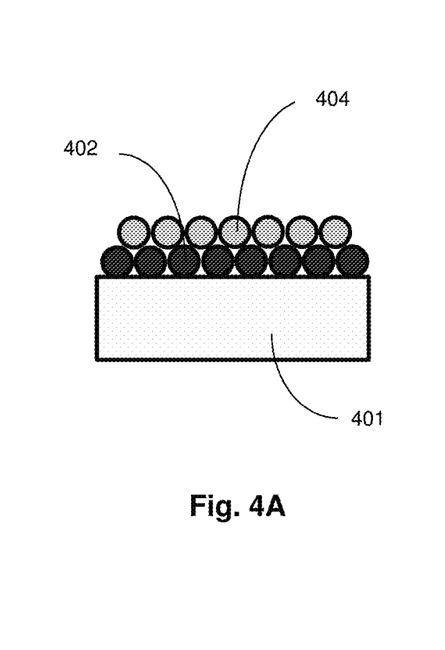
FIGS. 4A-4C are diagrammatic side views of an aluminum-containing layer being deposited on a substrate, in accordance with some embodiments of the disclosure.

Referring now to FIGS. 3 and 4A, the method 200 begins at block 202 where a substrate 401 in a chamber is contacted by an aluminum precursor in a first pulse 310 having a first peak pulse flow rate 312 and a first pulse width 316. In some embodiments, the aluminum precursor is trimethylaluminum (TMA). In some implementations, the first peak pulse flow rate 312 can be between about 4800 standard cubic centimeter per minute (SCCM) and 5500 SCCM, including about 5000 SCCM. As shown in FIG. 3, the first pulse 310 includes a steady-state width 314 after the first pulse 310 has reached a steady state. The chamber is purged of the aluminum precursor after the end of the first pulse 310. In some embodiments, the chamber is purged of the aluminum precursor by use of an inert gas, such as argon (Ar), nitrogen ($N_2$) or helium (He). The operations at block 202 can deposit an aluminum layer 402 on the substrate 401.

The method 200 proceeds to block 204 where the substrate 401 in FIG. 4A is contacted with a nitrogen-containing precursor. In some embodiments, the nitrogen-containing precursor can be ammonia ($NH_3$). Referring now to FIG. 4A, shown therein is a diagrammatic side view of an aluminum-containing layer being deposited on a substrate 401. The operations at block 204 can deposit on the substrate 401 a nitrogen layer 404 that is covalently bonded to the aluminum layer 402. The operations in blocks 202 and 204 can be referred to a cycle of ALD or depositing an aluminum-containing layer formed by reaction between the aluminum precursor and the nitrogen-containing precursor. In the embodiments where the aluminum precursor is TMA and the nitrogen-containing precursor is nitrogen or ammonia, the aluminum-containing layer includes aluminum nitride (AlN). In some instances, the temperature of the chamber can be maintained at a temperature conducive to the reaction between the first and second precursors. In some implementations, such a temperature is between about 300° C. and about 400° C. The chamber is purged of the nitrogen-containing precursor after the end of the block 204. In some embodiments, the chamber is purged of the nitrogen-containing precursor by use of an inert gas, such nitrogen ($N_2$), argon (Ar) or helium (He).

Figure 4B:
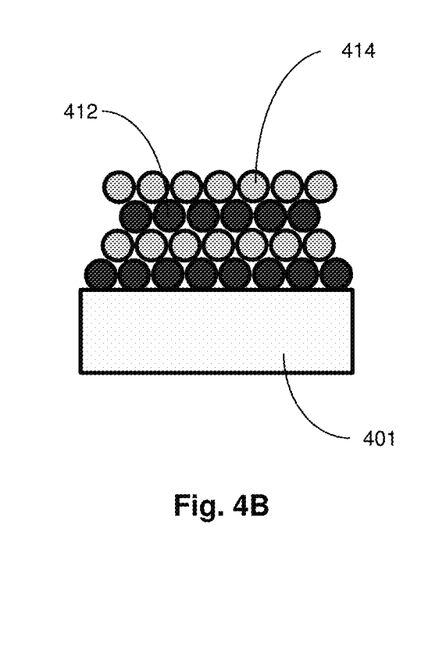

Referring now to FIGS. 3 and 4B, the method 200 then proceeds to block 206 where the substrate 401 in the chamber is contacted by the aluminum precursor in a second pulse 320 having a second peak pulse flow rate 322 and a second pulse width 326. In some embodiments, the aluminum precursor is TMA. In some embodiments, the second peak pulse flow rate 322 can be between about 3900 SCCM and 4200 SCCM, including about 4100 SCCM. As shown in FIG. 3, the second pulse 320 includes a steady-state width 324 after the second pulse 320 has reached a steady state. The chamber is purged of the aluminum precursor after the end of the second pulse 320. In some embodiments, the chamber is purged of the aluminum precursor by use of an inert gas, such nitrogen ($N_2$), argon (Ar) or helium (He). The operations at block 206 can deposit an aluminum layer 412 over the nitrogen layer 404 on the substrate 401.

In some embodiments, the first peak pulse flow rate 312 is greater than the second peak pulse flow rate 322. In some embodiments, the first pulse width 316 is smaller than the second pulse width 326. In some embodiments, a product of the first peak pulse flow rate 312 and the first pulse width 316 (i.e. (the first peak pulse flow rate 312)×(the first pulse width 316)) is substantially identical to a product of the second peak pulse flow rate 322 and the second pulse width 326 (i.e. (the second peak pulse flow rate 322)×(the second pulse width 326)). In some embodiments, a product of the first peak pulse flow rate 312 and the steady-state width 314 (i.e. (the first peak pulse flow rate 312)×(the steady-state width 314)) is substantially identical to a product of the second peak pulse flow rate 322 and the steady-state width 324 (i.e. (the second peak pulse flow rate 322)×(the steady-state width 324)). In some embodiments, the total amount of the aluminum precursor supplied to the chamber in the first pulse 310 is substantially identical to the total amount of the aluminum precursor in the second pulse 320. In some instances, an integral of instantaneous flow rate of the aluminum precursor over time in the first pulse 310 is substantially identical to an integral of flow rate of the aluminum precursor over time in the second pulse 320. In some instances, an integral of steady-state instantaneous flow rate of the aluminum precursor over time in the first pulse 310 is substantially identical to an integral of steady-state instantaneous flow rate of the aluminum precursor over time in the second pulse 320. The first integral and second integral can be represented as $$\int_{T1(P1)}^{T0(P1)} F(P1) = \int_{T1(P2)}^{T0(P2)} F(P2)$$

where T0(P1) and T0(P2) are the time of the onset of the first pulse 310 and the second pulse 320, respectively, and T1(P1) and T1(P2) are the time of the end of the first pulse 310 or the second pulse 320, respectively; F(P1) is the instantaneous flow rate in the first pulse 310; and the F(P2) is the instantaneous flow rate in the second pulse 320. In some instances, T0(P1) and T0(P2) are the time of the onset of a steady-state instantaneous flow rate of the first pulse 310 and the second pulse 320, respectively.

The method 200 proceeds to block 208 where the substrate 401 in FIG. 4B is contacted with the nitrogen-containing precursor. In some embodiments, the nitrogen-containing precursor can be ammonia. The operations at block 208 can deposit on the substrate 401 a nitrogen layer 414 that is covalently bonded to the aluminum layer 412. The operations in blocks 206 and 208 can be referred to as a cycle of ALD for depositing an aluminum-containing layer formed by reaction between the aluminum precursor and the nitrogen-containing precursor. In the embodiments where the aluminum precursor is TMA and the nitrogen-containing precursor is ammonia, the aluminum-containing layer includes aluminum nitride (AlN). In some instances, the temperature of the chamber can be maintained at a temperature conducive to the reaction between the first and second precursors. In some implementations, such a temperature is between about 300° C. and about 400° C. The chamber is purged of the nitrogen-containing precursor after the end of the block 208. In some embodiments, the chamber is purged of the nitrogen-containing precursor by use of an inert gas, such as nitrogen ($N_2$), argon (Ar) or helium (He).

Figure 4C:
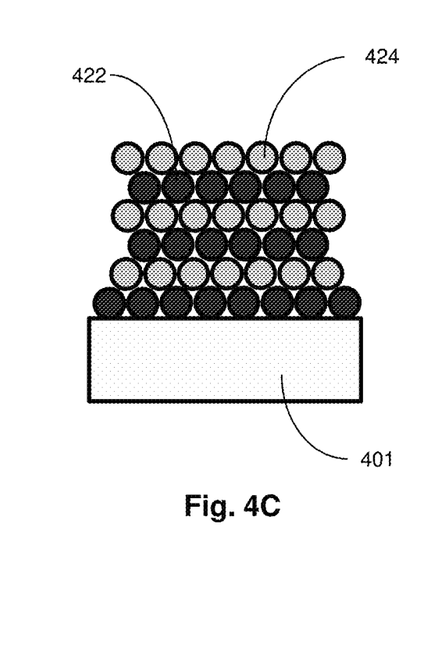

Referring still to FIGS. 3 and 4C, the method 200 proceeds to block 210 where the substrate 401 in the chamber is contacted by the aluminum precursor in a third pulse 330 having a third peak pulse flow rate 332 and a third pulse width 336. In some embodiments, the aluminum precursor is TMA. In some embodiments, the third peak pulse flow rate 332 can be between about 3600 SCCM and 4000 SCCM, including about 3800 SCCM. As shown in FIG. 3, the third pulse 330 includes a steady-state width 334 after the third pulse 330 has reached a steady state. The chamber is purged of the aluminum precursor after the end of the third pulse 330. The operations at block 210 can deposit an aluminum layer 422 over the nitrogen layer 414 on the substrate 401.

In some embodiments, the second peak pulse flow rate 322 is greater than the third peak pulse flow rate 332. In some implementations, the second pulse width 326 is smaller than the third pulse width 336. In some embodiments, a product of the second peak pulse flow rate 322 and the second pulse width 326 is substantially identical to a product of the third peak pulse flow rate 332 and the third pulse width 336. In some embodiments, a product of the second peak pulse flow rate 322 and the steady-state width 324 is substantially identical to a product of the third flow rate 332 and the steady-state width 334. In some embodiments, the total amount of the aluminum precursor supplied to the chamber in the second pulse 320 is substantially identical to the total amount of the aluminum precursor in the third pulse 330. In some embodiments, an integral of flow rate of the aluminum precursor over time in the second pulse 320 is substantially identical to an integral of flow rate of the aluminum precursor over time in the third pulse 330. In some instances, an integral of steady-state instantaneous flow rate of the aluminum precursor over time in the second pulse 320 is substantially identical to an integral of steady-state instantaneous flow rate of the aluminum precursor over time in the third pulse 330. The integrals can be represented as $$\int_{T1(P2)}^{T0(P2)} F(P2) = \int_{T1(P3)}^{T0(P3)} F(P3)$$

where T0(P2) and T0(P3) are the time of the onset of the second pulse 320 and the third pulse 330, respectively, and T1(P2) and T1(P3) are the time of the end of the second pulse 320 or the third pulse 330, respectively; F(P2) is the instantaneous flow rate in the second pulse 320; and the F(P3) is the instantaneous flow rate in the third pulse 330. In some instances, T0(P2) and T0(P3) are the time of the onset of a steady-state instantaneous flow rate of the second pulse 320 and the third pulse 330, respectively.

The method 200 then proceeds to block 212 where the substrate 401 in FIG. 4C is contacted with the nitrogen-containing precursor. In some embodiments, the nitrogen-containing precursor can be ammonia ($NH_3$). The operations at block 212 can deposit on the substrate 401 a nitrogen layer 424 that is covalently bonded to the aluminum layer 422. The operations in blocks 210 and 212 can be referred to a cycle of ALD or depositing an aluminum-containing layer formed by reaction between the aluminum precursor and the nitrogen-containing precursor. In the embodiments where the aluminum precursor is TMA and the nitrogen-containing precursor is ammonia, the aluminum-containing layer includes aluminum nitride (AlN). In some instances, the temperature of the chamber can be maintained at a temperature conducive to the reaction between the first and second precursors. In some implementations, such a temperature is between about 300° C. and about 400° C. The chamber is purged of the nitrogen-containing precursor after the end of the block 212. In some embodiments, the chamber is purged of the nitrogen-containing precursor by use of an inert gas, such as nitrogen ($N_2$), argon (Ar) or helium (He).

The method 200 proceeds to block 214 where operation in blocks 210 and 212 are repeated to increase a thickness of the aluminum-containing layer. Because block 210 and 212 includes a cycle for depositing a single layer of the aluminum-containing layer, repeating blocks 210 and 212 is repeating a cycle of depositing the aluminum-containing layer. No matter how many times the blocks 210 and 212 are to be repeated, the method 200 maintains a constant total amount of the aluminum precursor supplied to the chamber in each pulse by maintaining constant the integral of the instantaneous flow rate over time, a product of the peak pulse flow rate and the pulse width, or a product of the peak pulse flow rate and the steady-state pulse width.

The method 200 can be performed by the deposition system 100. Specifically, the method 200 can be performed by the control system 120 of the deposition system 100. In some embodiments, the control system 120 can be programmed to perform the method 200.

Figure 5A:
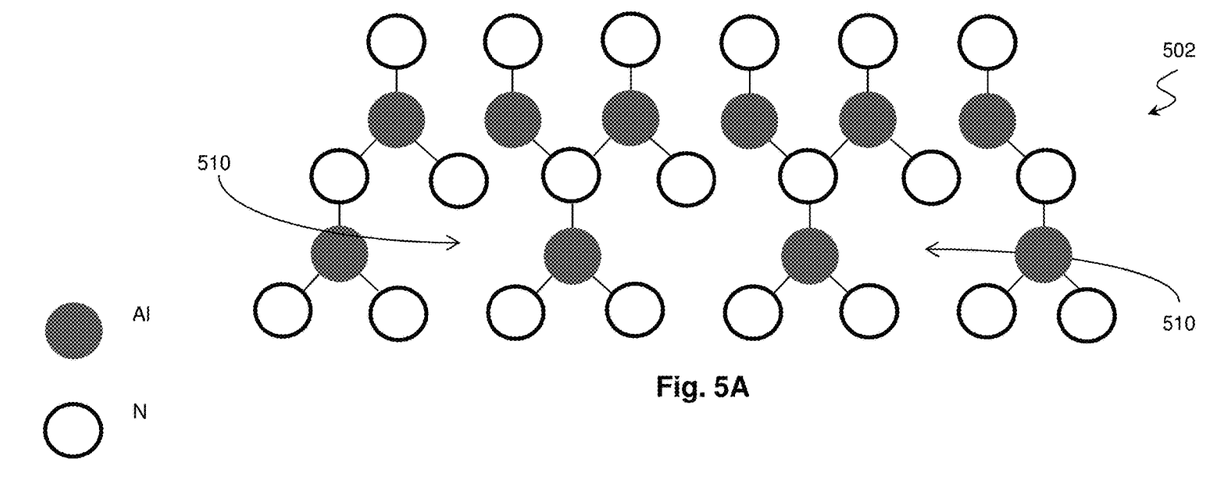
FIGS. 5A and 5B are simplified schematic illustrations of lattice structures of an aluminum-containing layer, in accordance with some embodiments of the disclosure.
Figure 5B:
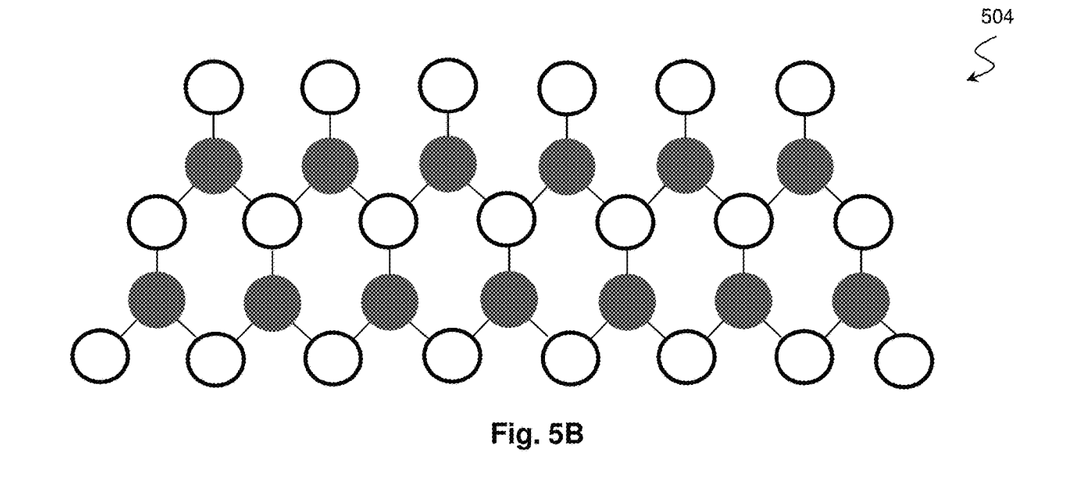

Because the method 200 modulates the pulse width or steady-state pulse width in relation to the peak pulse flow rate, the method 200 of the present disclosure provides several benefits. FIGS. 5A and 5B are simplified schematic illustrations of lattice structures of an aluminum-containing layer. Referring now to FIG. 5A, when the method 200 of the present disclosure is not used (i.e. each pulse has equal pulse width), the saturated vapor pressure of TMA that is supplied to the chamber can drop over time and maintaining a constant TMA pulse width or a constant steady-state TMA pulse width can result in insufficient supply of TMA, resulting in defects 510, such as vacancies/voids. The defects 510 cause the aluminum-containing layer 502 to be porous. When the concentration of defects 510 reaches a threshold ratio, a leakage path, can be formed to increase leakage current. As shown in FIG. 5B, when the method 200 is adopted, the defects 510 in the as-formed aluminum-containing layer 504 can be substantially reduced or eliminated, thus eliminating the leakage path and reducing the leakage current.

Figure 6A:
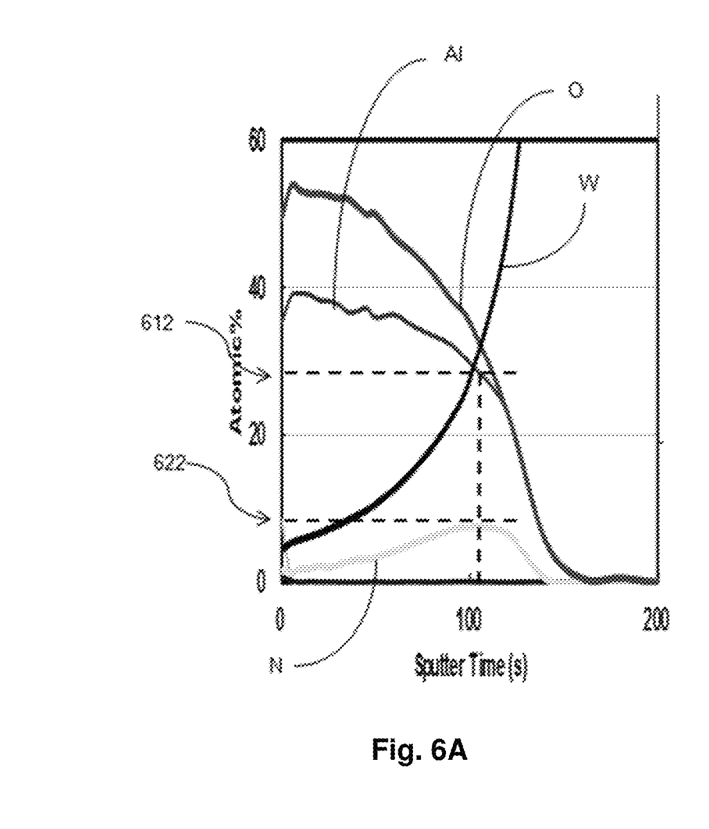
FIGS. 6A and 6B illustrate atomic concentrations over sputter time measured by secondary ion mass spectrometer (SIMS), in accordance with some embodiments of the disclosure.
Figure 6B:
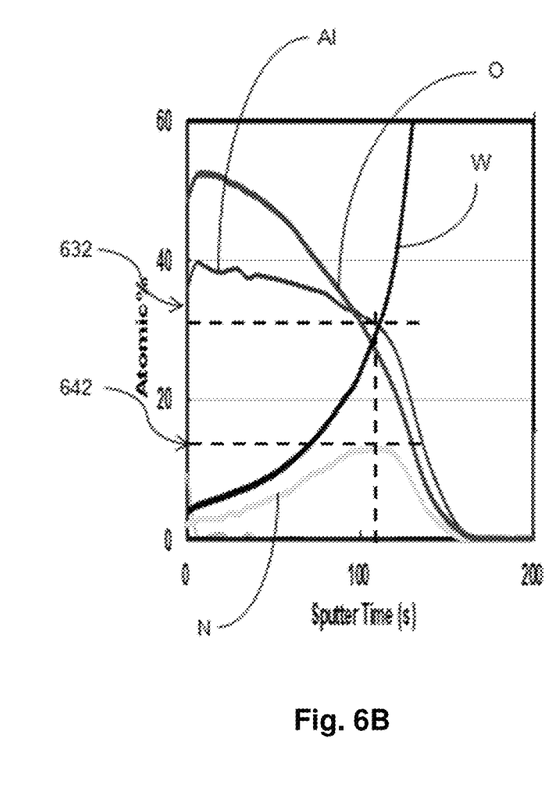

FIG. 6A illustrates a depth profile of an AlN layer, obtained by secondary ion mass spectrometer (SIMS), when the method 200 is not used. FIG. 6B, illustrates a depth profile of an AlN layer, obtained by SIMS, when the method 200 is adopted. Because the depth profiles are generated by sputtering the surfaces of the AlN layers with a primary ion beam and the primary ion beam continues to remove topmost material during sputtering to create a crater on the surfaces, the sputter time can serve as measurement of depth. The depth profiles in FIGS. 6A and 6b therefore represent atomic percentage of atomic species, including oxygen (O), nitrogen (N), aluminum (Al) and tungsten (W) over a depth of a crater created by sputtering the surface for 200 seconds. The depth profiles in FIG. 6A and that in FIG. 6B can be compared at the peak nitrogen atomic concentration. In FIG. 6A, the aluminum atomic concentration 612 is about 23% while the nitrogen atomic concentration 622 is about 10%, resulting in an aluminum atomic concentration of about 70% in the AlN layer. In FIG. 6B, the aluminum atomic concentration 632 is about 33% while the nitrogen atomic concentration 642 is about 12%, resulting in an aluminum atomic concentration above 73% in the AlN layer. In some instances, the aluminum atomic concentration of an AlN layer deposited using the method 200 of the present disclosure can be between about 71% and about 74%, including about 72%. The increase in aluminum content in the AlN layer can be attributed to the use of the method 200, which compensates for the drops in instantaneous flow rate of a precursor by prolonging a pulse width for the precursor. The increase in aluminum content in the AlN layer can also be attributed to the use of the deposition system 100, which also compensates for the drops in instantaneous flow rate of a precursor by prolonging a pulse width for the precursor. The tungsten plug or tungsten contact in contact with the AlN layers account for the tungsten atomic concentration profiles present in the depth profiles in FIGS. 6A and 6B.

Figure 7:
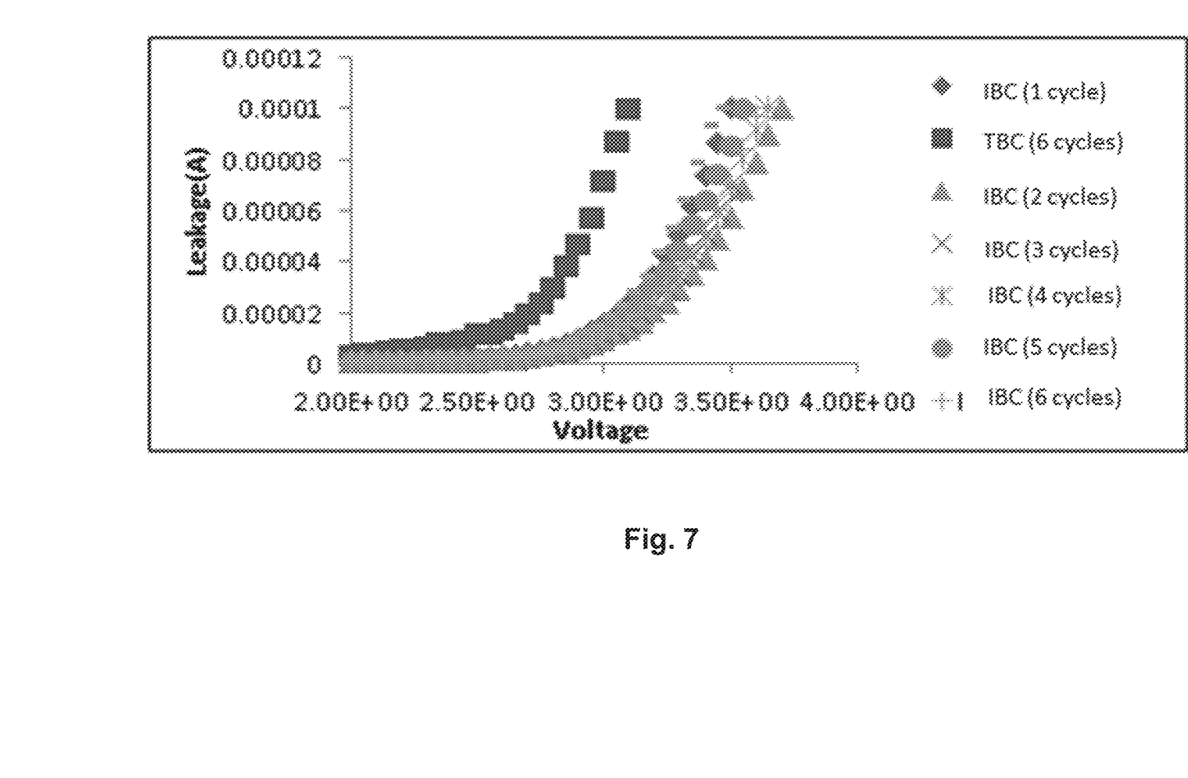
FIG. 7 illustrates leakage of an aluminum-containing layer at different voltages, in accordance with some embodiments of the disclosure.

Referring now to FIG. 7, shown therein is leakage of an aluminum-containing layer at different voltages, in accordance with some embodiments of the disclosure. When the method 200 of the present disclosure is not used, the vacancies/voids in the aluminum-containing layer result in higher leakage current at lower temperature. For example, the "TBC (6 cycles)" curve in FIG. 7 is the leakage current curve of an aluminum-containing layer formed using a time-based control (TBC) method different from the method 200. Even after 6 cycles, the leakage current is about 0.0008 A at about 3V. In contrast, when the method 200 of the present disclosure is adopted, the leakage current after 6 cycles, represented by the "IBC" curve in FIG. 7, experience a leakage current of 0.00008 A at a substantially higher 3.5V. Here, "IBC" stands for integral based control. At an applied voltage of 3.0V, the leakage current is below 0.00002 A when the method 200 of the present disclosure is adopted. FIG. 7 indicates advantages of using the method 200 as the leakage current is substantially reduced.

Figure 8:
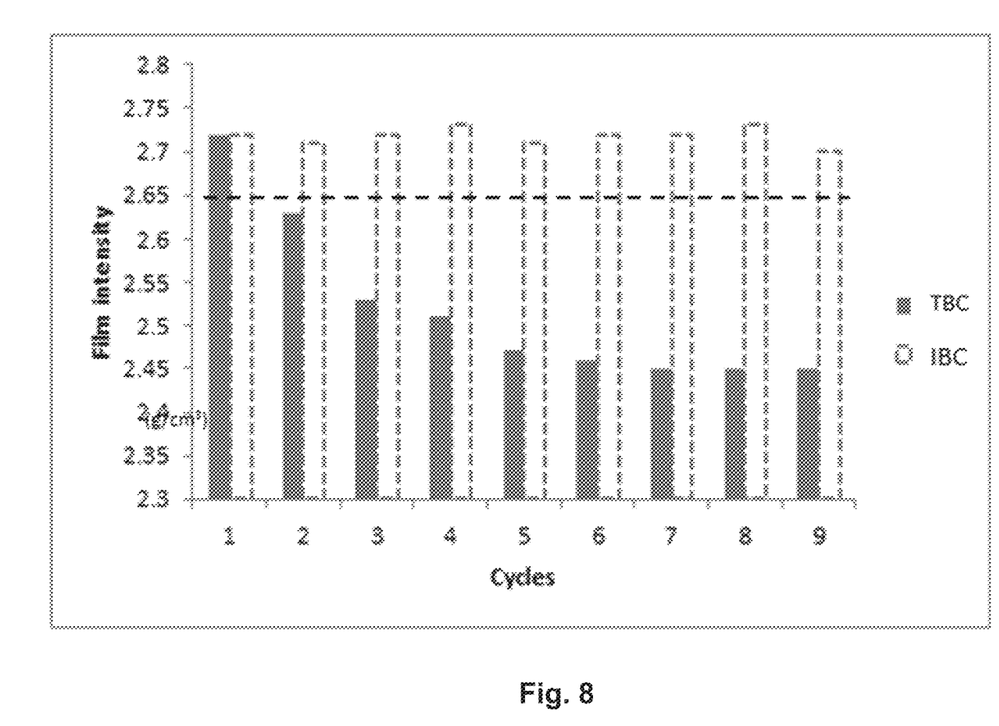
FIG. 8 illustrates density of an aluminum-containing layer over deposition cycles, in accordance with some embodiments of the disclosure.

FIG. 8 illustrates densities of different sub-layers (i.e. single layers) in an aluminum-containing layer, in accordance with some embodiments of the disclosure. Please refer to the TBC (time based control) bars in FIG. 8. When the method 200 of the present disclosure is not used, each additional layer deposited in a cycle has a density lower than that of the preceding layer. For example, while the film density after the first cycle is about 2.71 g/cm$^3$, shown by the TBC bar in the No. 1 cycle. The film density drops through the following cycles to about 2.63 g/cm$^3$ after the No. 2 cycle, about 2.53 g/cm$^3$ after the No. 3 cycle, about 2.51 g/cm$^3$ after the No. 4 cycle, about 2.47 g/cm$^3$ after the No. 5 cycle, about 2.46 g/cm$^3$ after the No. 6 cycle, about 2.45 g/cm$^3$ after the Nos. 7, 8 and 9 cycles. In contrast, as shown by the IBC (integral based control) bars in FIG. 8, when the method 200 of the present disclosure is adopted, the film density of each cycle is consistently above about 2.65 g/cm$^3$, including above about 2.70 g/cm$^3$. The increase in film density is attributed to the reduction of vacancies/voids, such as the vacancies/voids 510 in FIG. 5A.

Figure 9:
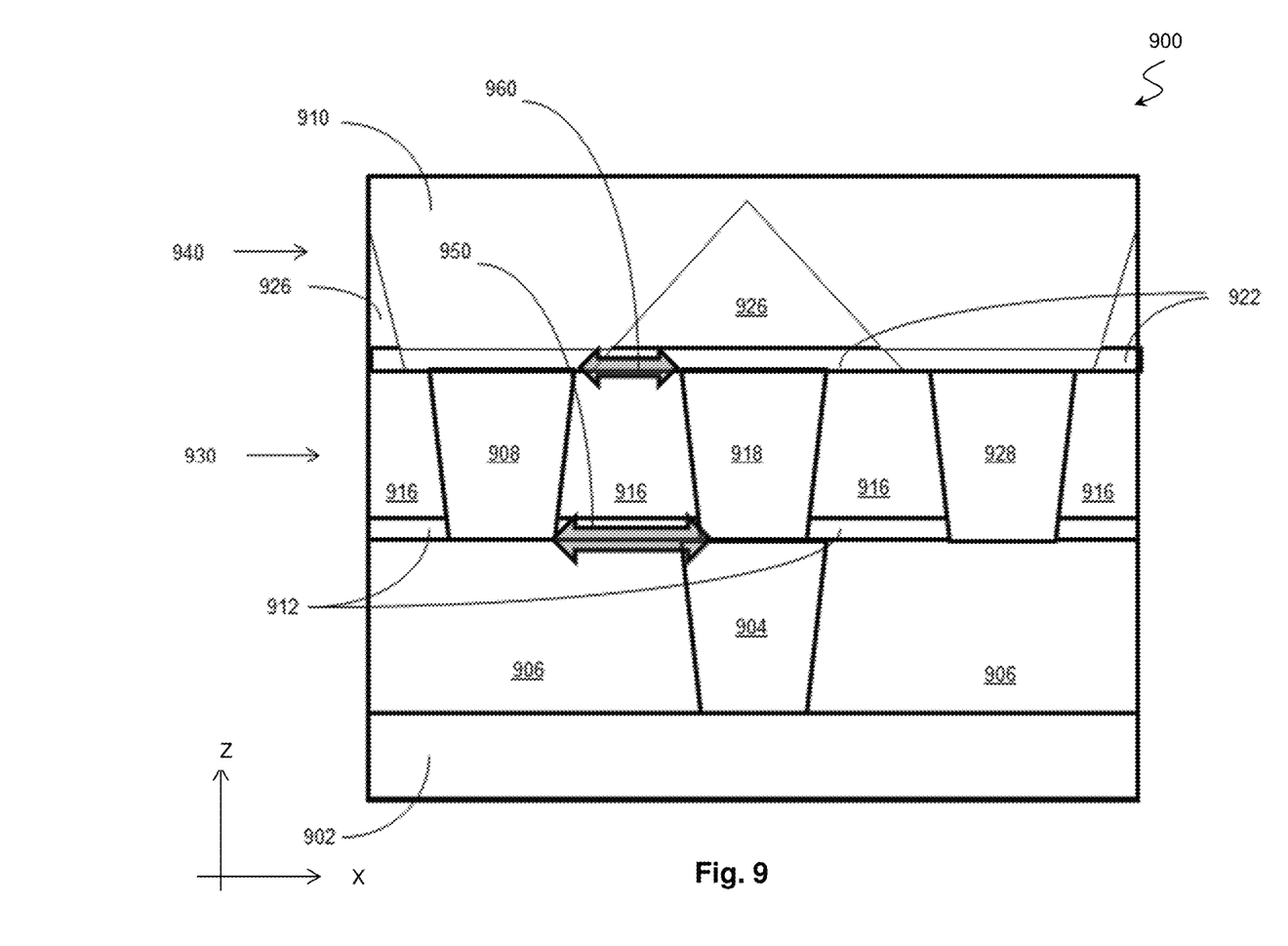
FIG. 9 shows a diagrammatic cross-sectional view of an interconnect structure on a semiconductor device, in accordance with some embodiments of the disclosure.

FIG. 9 shows a diagrammatic cross-sectional view of an interconnect structure 900 on a semiconductor device. In the embodiments represented in FIG. 9, the interconnect structure 900 includes a metal feature 902, a via contact 904, metal features 908, 918, and 928 in a first metal layer 930, a via contact 910 in a second metal layer 940. The metal feature 902 can be a source/drain contact of a transistor (e.g., metal oxide semiconductor field effect transistors (MOSFET), complementary metal oxide semiconductor (CMOS) transistors, a fin-type field effect transistor (FinFET), bipolar junction transistors (BJT), high-voltage transistors, high-frequency transistors, p-channel and/or n channel field effect transistors (PFETs/NFETs), etc.) that is a part of a static random access memory (SRAM) or a logic circuit. In some embodiments, the metal feature 902 can be a contact to a passive component, such as a resistor, capacitor, or inductor. To form the interconnect structure 900 over the metal feature 902, dielectric material is deposited over the metal feature 902 to form an interlayer dielectric (ILD) 906. A via is then formed within the ILD 906 by anisotropic etching, exposing a portion of the metal feature 902. In some implementations, the anisotropic etching is performed by using an etch gas including fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof. In' some embodiments, the ILD 906 can be formed of tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The via is then filled with a conductive material to form the via contact 904. In some embodiments, the conductive material may include tungsten (W), copper (Cu), cobalt (Co), ruthenium (Ru), aluminum (Al), rhodium (Rh), molybdenum (Mo), tantalum (Ta), titanium (Ti), silicide, or other conductive material. In some embodiments, the via is filled by the conductive material by a plating process. To create a planar top surface for later processes, the top surfaces of the ILD 906 and the via contact 904 can be planarized by techniques such as chemical mechanical polishing (CMP). The via contact 904 allows the metal feature 902 to be in electrical communication with one or more features in the first metal layer 930.

To form metal features 908, 918 and 928 in the first metal layer 930, an etch stop layer (ESL) 912 is deposited on the top surface of the via contact 904 and the ILD 906, followed by deposition of another ILD 916 over the ESL 912. The ILD 916 and the ILD 906 can be formed of the same material. In some implementations, the ESL 912 can be formed of aluminum nitride (AlN) deposited using various deposition techniques, such as chemical vapor deposition (CVD), plasma-enhanced CVD (PECVD), atomic layer deposition (ALD), and plasma-enhanced atomic layer deposition (PEALD). In some instance, the ESL 912 may be formed of aluminum nitride deposited using method 200 of the present disclosure. In these implementations, because ESL 912 does not contain silicon (as compared to silicon-containing dielectric materials such as silicon oxide, silicon carbide, silicon oxynitride and silicon nitride), wet or dry etching chemistry can be selected to have a high etching selectivity with respect to ILD 916, which can be formed of silicon oxide or silicon-containing low-K materials. As such, ESL 912 allows better control of the etching through the ILD 916 when the vias for metal features 908, 918 and 928 are formed in the first metal layer 930. The vias formed in the first metal layer 930 are then filled with conductive material, such as tungsten (W), copper (Cu), cobalt (Co), ruthenium (Ru), aluminum (Al), rhodium (Rh), molybdenum (Mo), tantalum (Ta), titanium (Ti), silicide, or other conductive material, to form the metal features 908, 918 and 928. The metal features 908, 918 and 928 and the ILD 916 may be planarized by CMP before further fabrication ensues.

The metal features 908 and 928 in the interconnect structure 900 are put in electrical contact with a metal feature 910 in the second metal layer 940. Similar to the formation of the metal features 908, 918 and 928 in the first metal layer 930, the formation of the metal feature 910 begins with deposition of a ESL 922. In some implementations, the ESL 922 can be formed of aluminum nitride (AlN) deposited using various deposition techniques, such as CVD, PECVD, ALD, and PEALD. In some instance, the ESL 922 may be formed of aluminum nitride deposited using method 200 of the present disclosure. Over the ESL 922, an ILD 926 is deposited. The ILD 926 and the ILD 906 can be formed of the same material. ESL 922 is then used to control the etching process for forming vias through the ILD 926 and the ESL 922, exposing the metal features 908 and 928.

In some embodiments, the ESL 912 and ESL 922 are formed of aluminum nitride by ALD using method of the present embodiment and each have a density measured by X-ray reflectometry (XRR) between about 2.65 g/cm3 and about 2.75 g/cm3 throughout their respective depth along the Z direction. In some implementation, the ESL 912 and ESL 922 each have an aluminum concentration between about 71 atomic % and about atomic 74% based on secondary ion mass spectrometry (SIMS). In other words, the Al atoms in the ESL 912 and ESL 922, account for between about 71 atomic % and about 74 atomic % of all Al atoms and N atoms in the ESL 912 and ESL 922. For example, the Al atoms in the ESL 912 and ESL 922 can account for about 72% of all Al atoms and N atoms in the ESL 912 and ESL 922. In some embodiments, the ALD process used to form the ESL 912 and ESL 922 can include 2 to 10 process cycles, which correspond to 2 to 10 atomic layers of aluminum nitride. The density across the entire 2 to 10 atomic layers of aluminum nitride in the ESL 912 and ESL 922 has a minimum density measured by XRR of about 2.65 g/cm3. In some instances, the ESL 912 and ESL 922 each have a thickness between about 10 Å and about 50 Å.

The high density and high Al concentration of the ESL 912 and ESL 922 provide several benefits. For example, the ESL 912 can reduce leakage along a path 950 between the metal feature 908 and the metal feature 904/metal feature 918. For another example, the ESL 922 can reduce leakage along a path 960 between the metal feature 918 and the metal feature 908/metal feature 910.

In one embodiment, the present disclosure provides a method. The method includes depositing an aluminum-containing layer on a substrate in a chamber by atomic layer deposition. The depositing of the aluminum-containing layer includes contacting the substrate with an aluminum-containing precursor in a first pulse having a first peak pulse flow rate and a first pulse width, contacting the substrate with a nitrogen-containing precursor, contacting the substrate with the aluminum-containing precursor in a second pulse having a second peak pulse flow rate and a second pulse width, and contacting the substrate with the nitrogen-containing precursor. The first peak pulse flow rate is greater than the second peak pulse flow rate and the first pulse width is smaller than the second pulse width.

In some embodiments, a product of the first peak pulse flow rate and the first pulse width is substantially identical to a product of the second peak pulse flow rate and the second pulse width. In some embodiments, a first total amount of the aluminum precursor in the first pulse is substantially identical to a second total amount of the aluminum precursor in the second pulse. In some implementations, a first integral of flow rate of the aluminum precursor over time in the first pulse is substantially identical to a second integral of flow rate of the aluminum precursor over time in the second pulse. In some instances, the aluminum precursor includes trimethylaluminum (TMA). In some embodiments, the nitrogen-containing precursor comprises ammonia ($NH_3$). In some embodiments, the method may further include purging the chamber of the aluminum precursor, and purging the chamber of the nitrogen-containing precursor. In some implementations, the first pulse width is a pulse duration after the first peak pulse flow rate has been reached and the second pulse width is a pulse duration after the second peak pulse flow rate has been reached. In some instances, the method may further include depositing a dielectric layer over the aluminum-containing layer, forming an opening through the dielectric layer and the aluminum-containing layer using the aluminum-containing layer as an etch stop layer, and filling the opening with a conductive material.

In another embodiment, the present disclosure provides a method for depositing a layer on a substrate by atomic layer deposition in a plurality of cycles. The method includes providing a system. The system includes a reactor, a flow rate sensor positioned at an inlet port leading to the reactor, a valve configured to control fluid communication between a gas source of a precursor and the inlet port, and a control system in electrical communication with the flow rate sensor and the valve. The method further includes controlling the valve according to a flow rate of the precursor measured by the flow rate sensor to maintain a constant amount of the precursor flowing into the reactor in each of the plurality of cycles.

In some embodiments, the controlling of the valve includes maintaining a constant integral of the flow rate of the precursor and a duration during which the gas source of the precursor and the inlet port is in fluid communication. In some embodiments, the controlling of the valve includes maintaining a constant product of a peak pulse flow rate measured by the flow rate sensor and a duration which the gas source of the precursor and the inlet port is in fluid communication. In some embodiments, the controlling of the valve includes maintaining a constant product of a peak pulse flow rate measured by the flow rate sensor and a duration during which the gas source of the precursor and the inlet port is in fluid communication after the peak pulse flow rate is reached. In some embodiments, the method may further include increasing, by a heating unit, a temperature of the reactor to between about 300° C. and about 400° C. In those embodiments, the system further includes the heating unit. In some embodiments, the layer includes aluminum nitride and the precursor includes trimethylaluminum. In some implementations, the system further includes another valve configured to control fluid communication between another gas source of another precursor and the inlet port and the another precursor is ammonia. In some instances, the method further includes controlling the another valve according to a duration during which the another gas source of the another precursor and the inlet port are in fluid communication.

In still another embodiment, the present disclosure provides an interconnect structure that includes a first interlayer dielectric layer on a semiconductor substrate, an etch stop layer on the first interlayer dielectric layer, and a second interlayer dielectric layer on the etch stop layer. The etch stop layer includes aluminum (Al) and nitrogen atom (N) and the etch stop layer includes an average density greater than 2.65 g/cm$^3$ measured by X-ray reflectometry (XRR) throughout the etch stop layer.

In some embodiments, a molar ratio between Al in the etch stop layer, on one hand, and Al and N in the etch stop layer, on the other hand, in the etch stop layer is over 72% measured by secondary ion mass spectrometry (SIMS). In some embodiments, the etch stop layer has a thickness between about 10 nm and about 50 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   depositing an aluminum-containing layer on a substrate in a chamber by atomic layer deposition, wherein the depositing further includes:
   contacting the substrate with an aluminum-containing precursor in a first pulse having a first peak pulse flow rate and a first pulse width;

contacting the substrate with a nitrogen-containing precursor;

contacting the substrate with the aluminum-containing precursor in a second pulse having a second peak pulse flow rate and a second pulse width; and contacting the substrate with the nitrogen-containing precursor, wherein the first peak pulse flow rate is greater than the second peak pulse flow rate, wherein the first pulse width is smaller than the second pulse width.

2. The method of claim 1, wherein a product of the first peak pulse flow rate and the first pulse width is substantially identical to a product of the second peak pulse flow rate and the second pulse width.

3. The method of claim 1, wherein a first total amount of the aluminum-containing precursor in the first pulse is substantially identical to a second total amount of the aluminum-containing precursor in the second pulse.

4. The method of claim 1, wherein a first integral of flow rate of the aluminum-containing precursor over time in the first pulse is substantially identical to a second integral of flow rate of the aluminum-containing precursor over time in the second pulse.

5. The method of claim 1, wherein the aluminum-containing precursor comprises trimethylaluminum (TMA).

6. The method of claim 1, wherein the nitrogen-containing precursor comprises ammonia ($NH_3$).

7. The method of claim 1, furthering comprising:
purging the chamber of the aluminum-containing precursor; and
purging the chamber of the nitrogen-containing precursor.

8. The method of claim 1,
wherein the first pulse width is a pulse duration after the first peak pulse flow rate has been reached,
wherein the second pulse width is a pulse duration after the second peak pulse flow rate has been reached.

9. The method of claim 1, further comprising:
depositing a dielectric layer over the aluminum-containing layer;
forming an opening through the dielectric layer and the aluminum-containing layer using the aluminum-containing layer as an etch stop layer; and
filling the opening with a conductive material.

10. A method for depositing a layer on a substrate by atomic layer deposition in a plurality of cycles, comprising:
providing a system comprising:
a reactor,
a flow rate sensor positioned at an inlet port leading to the reactor,
a valve configured to control fluid communication between a gas source of a precursor and the inlet port, and
a control system in electrical communication with the flow rate sensor and the valve; and
controlling the valve according to a flow rate of the precursor measured by the flow rate sensor to maintain a constant amount of the precursor flowing into the reactor in each of the plurality of cycles.

11. The method of claim 10, wherein the controlling of the valve comprises maintaining a constant integral of the flow rate of the precursor and a duration during which the gas source of the precursor and the inlet port is in fluid communication.

12. The method of claim 10, wherein the controlling of the valve comprises maintaining a constant product of a peak pulse flow rate measured by the flow rate sensor and a duration which the gas source of the precursor and the inlet port is in fluid communication.

13. The method of claim 10, wherein the controlling of the valve comprises maintaining a constant product of a peak pulse flow rate measured by the flow rate sensor and a duration during which the gas source of the precursor and the inlet port is in fluid communication after the peak pulse flow rate is reached.

14. The method of claim 10, further comprising:
increasing, by a heating unit, a temperature of the reactor to between about 300° C. and about 400° C.,
wherein the system further comprises the heating unit.

15. The method of claim 10, wherein the layer comprises aluminum nitride and the precursor comprises trimethylaluminum.

16. The method of claim 10, wherein the system further comprises another valve configured to control fluid communication between another gas source of another precursor and the inlet port and the another precursor is ammonia.

17. The method of claim 16, further comprising:
controlling the another valve according to a duration during which the another gas source of the another precursor and the inlet port are in fluid communication.

18. A system, comprising:
a reactor;
a flow rate sensor positioned at an inlet port leading to the reactor;
a valve configured to control fluid communication between a gas source of a precursor and the inlet port; and
a control system in electrical communication with the flow rate sensor and the valve, wherein the control system is configured to:
control the valve according to a flow rate of the precursor measured by the flow rate sensor to maintain a constant amount of the precursor flowing into the reactor in each of the plurality of cycles.

19. The system of claim 18, wherein the control system is further configured to maintain a constant integral of the flow rate of the precursor and a duration during which the gas source of the precursor and the inlet port is in fluid communication.

20. The system of claim 18, wherein the control system is further configured to maintain a constant product of a peak pulse flow rate measured by the flow rate sensor and a duration which the gas source of the precursor and the inlet port is in fluid communication.

* * * * *